(12) United States Patent
Bruzda et al.

(10) Patent No.: US 10,692,797 B2
(45) Date of Patent: *Jun. 23, 2020

(54) THERMAL INTERFACE MATERIALS WITH LOW SECANT MODULUS OF ELASTICITY AND HIGH THERMAL CONDUCTIVITY

(71) Applicant: Laird Technologies, Inc., Chesterfield, MO (US)

(72) Inventors: Karen Bruzda, Cleveland, OH (US); Kathryn Cancar, Lakewood, OH (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/222,403

(22) Filed: Dec. 17, 2018

(65) Prior Publication Data

US 2019/0122954 A1    Apr. 25, 2019

Related U.S. Application Data

(63) Continuation-in-part of application No. 15/819,379, filed on Nov. 21, 2017, now Pat. No. 10,155,896, which is a continuation-in-part of application No. 15/184,865, filed on Jun. 16, 2016, now Pat. No. 9,828,539.

(60) Provisional application No. 62/186,946, filed on Jun. 30, 2015.

(51) Int. Cl.
| | |
|---|---|
| *C08K 3/22* | (2006.01) |
| *H01L 23/373* | (2006.01) |
| *C08L 83/04* | (2006.01) |
| *C08K 3/08* | (2006.01) |
| *C08K 3/38* | (2006.01) |
| *C08K 3/28* | (2006.01) |
| *H05K 7/20* | (2006.01) |
| *C08K 3/013* | (2018.01) |
| *H01L 23/42* | (2006.01) |
| *C08K 3/04* | (2006.01) |
| *C08G 77/20* | (2006.01) |
| *C08G 77/12* | (2006.01) |

(52) U.S. Cl.
CPC .......... *H01L 23/3737* (2013.01); *C08K 3/013* (2018.01); *C08K 3/08* (2013.01); *C08K 3/22* (2013.01); *C08K 3/28* (2013.01); *C08K 3/38* (2013.01); *C08L 83/04* (2013.01); *H01L 23/42* (2013.01); *H05K 7/20481* (2013.01); *C08G 77/12* (2013.01); *C08G 77/20* (2013.01); *C08K 3/04* (2013.01); *C08K 2003/085* (2013.01); *C08K 2003/0806* (2013.01); *C08K 2003/0812* (2013.01); *C08K 2003/2227* (2013.01); *C08K 2003/2296* (2013.01); *C08K 2003/282* (2013.01); *C08K 2003/385* (2013.01); *C08L 2312/08* (2013.01)

(58) Field of Classification Search
CPC . C08K 3/013; C08K 3/08; C08K 3/22; C08K 3/28; C08K 3/38; C08L 83/04; H01L 23/42; H05K 7/20481
USPC ....................................................... 523/220
See application file for complete search history.

(56) References Cited

U.S. PATENT DOCUMENTS

| | | |
|---|---|---|
| 6,592,997 B2 | 7/2003 | Lewis et al. |
| 7,135,232 B2 | 11/2006 | Yamada et al. |
| 7,504,453 B2 | 3/2009 | Hu et al. |
| 7,695,817 B2 | 4/2010 | Lin et al. |
| 7,718,256 B1 | 5/2010 | Frank et al. |
| 7,744,991 B2 | 6/2010 | Fischer et al. |
| 8,324,313 B2 | 12/2012 | Funahashi |
| 8,334,591 B2 | 12/2012 | Kusano |
| 8,440,312 B2 | 5/2013 | Elahee |
| 8,477,499 B2 | 7/2013 | Hill et al. |
| 9,260,645 B2 | 2/2016 | Bruzda |
| 9,515,004 B2 | 12/2016 | Strader et al. |
| 9,771,508 B2 | 9/2017 | Bruzda et al. |
| 9,828,539 B2 | 11/2017 | Bruzda |
| 10,155,896 B2 | 12/2018 | Bruzda et al. |
| 10,155,986 B2 * | 12/2018 | Koh .................. G16B 50/00 |
| 2009/0068441 A1 | 3/2009 | Swaroop et al. |
| 2010/0310805 A1 | 12/2010 | Ou |
| 2011/0204280 A1 | 8/2011 | Bruzda |
| 2012/0068560 A1 | 3/2012 | Anderton et al. |
| 2012/0080639 A1 | 4/2012 | Bruzda et al. |
| 2015/0014577 A1 | 1/2015 | Chowdhury et al. |
| 2016/0130492 A1 | 5/2016 | Matsumura et al. |
| 2016/0160104 A1 | 6/2016 | Bruzda et al. |
| 2017/0002248 A1 | 1/2017 | Bruzda et al. |

FOREIGN PATENT DOCUMENTS

| | | |
|---|---|---|
| CN | 103289325 A | 9/2013 |
| CN | 103333494 A | 10/2013 |
| CN | 105621960 A | 6/2016 |
| WO | WO-2013169413 A1 | 11/2013 |

OTHER PUBLICATIONS

Hot Disk AB—Testing Thermal Conductivity / Hot Disk TPS 3500, <http://www.hotdiskinstruments.com/products/instruments-for-thermal-conductivity-measur>... Accessed Mar. 31, 2016, 5 pages.

* cited by examiner

*Primary Examiner* — Hannah J Pak (74) *Attorney, Agent, or Firm* — Harness, Dickey & Pierce, P.L.C.; Anthony G. Fussner (57) ABSTRACT

Disclosed are exemplary embodiments of thermal interface materials with low secant modulus of elasticity and high thermal conductivity.

20 Claims, 3 Drawing Sheets

THERMAL INTERFACE MATERIALS WITH LOW SECANT MODULUS OF ELASTICITY AND HIGH THERMAL CONDUCTIVITY

CROSS-REFERENCE TO RELATED APPLICATIONS

This application is a continuation-in-part of U.S. patent application Ser. No. 15/819,379 filed Dec. 18, 2018 (issuing as U.S. Pat. No. 10,155,896 on Dec. 18, 2018) which, in turn, is a continuation-in-part of U.S. patent application Ser. No. 15/184,865 filed Jun. 16, 2016 (now U.S. Pat. No. 9,828,539 issued on Nov. 28, 2017), which, in turn, claims the benefit and priority of U.S. Provisional Patent Application No. 62/186,946 filed Jun. 30, 2015. The entire disclosures of the above applications are incorporated herein by reference.

FIELD

The present disclosure relates to thermal interface materials with low secant modulus of elasticity and high thermal conductivity.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material. The thermal interface material may be used to fill the gap between thermal transfer surfaces, in order to increase thermal transfer efficiency as compared to having the gap filled with air, which is a relatively poor thermal conductor.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

There is a need for thermal interface materials (e.g., thermally-conductive gap pads or fillers, thermally-conductive dispensable materials, etc.) that provide low thermal resistance (e.g., about 1° C. $cm^2$/W or less, about 0.8° C. $cm^2$/W or less, etc.) combined with the ability to reach the desired thin bondline with relatively low pressure application (e.g., at a pressure that falls within a range of about 5 pounds per square inch (psi) to about 100 psi or from about 10 psi to about 50 psi, etc.). Accordingly, disclosed herein are exemplary embodiments of thermal interface materials with low secant modulus of elasticity (e.g., no more than 620 kilopascals (kPa) at 50% strain for 1.5 millimeter (mm) initial thickness material, etc.) and a high thermal conductivity (e.g., greater than 4 W/mK or higher, at least 5.5 W/mK, at least 5.7 W/mK, at least 6 W/mK or higher, etc.).

For example, an exemplary embodiment of a thermal interface material comprises a thermally-conductive gap filler having a thermal conductivity of about 9 W/mK and secant modulus of elasticity of about 17 kPA at 50% strain from an initial thickness of 1.5 mm. In another exemplary embodiment, a thermal interface material is dispensable and has a thermal conductivity of about 8.3 W/mK and secant modulus of elasticity of about 3.8 kPA at 50% strain from an initial thickness of 1.5 mm. In yet another exemplary embodiment, a thermal interface material is a thermally-conductive gap filler and has a thermal conductivity of about 9.08 W/mK and secant modulus of elasticity of about 269 kPA at 50% strain from an initial thickness of 1.5 mm. Other exemplary embodiments may have a different thermal conductivity (e.g., about 6 W/mK, 8 W/mK, 9 W/mK, 20 W/mK, greater than 4 W/mK, about 5.5 W/mK, about 5.7 W/mK, greater than 6 W/mK, greater than 9 W/mK, greater than 20 W/mK, from about 5 or 6 W/mK to about 20 W/mK, from about 5 or 6 W/mK to about 9 W/mK, etc.) and/or a different secant modulus of elasticity (e.g., a secant modulus no more than about 14 kPa at 50% strain for 1.5 mm initial thickness material, a secant modulus no more than about 620 kPa at 50% strain for 1.5 mm initial thickness material, a secant modulus of from about 14 kPa to about 620 kPa at 50% strain for 1.5 mm initial thickness material, etc.).

Accordingly, exemplary embodiments disclosed herein have or demonstrate a unique combination of relatively high thermal conductivity coupled with low secant modulus of elasticity (or very high compliancy). Compliancy may be quantified by secant modulus of elasticity, as a material having a lower secant modulus of elasticity than another material will also be more compliant or have a higher compliancy than that other material. The combination of high thermal conductivity and a low secant modulus allows the thermal interface materials disclosed herein to be more easily deflected to the desired bondline, which, in turn, may help prevent excess pressures from building up during deflection and damaging delicate components. At the bondline, the thermal resistance may be very low due to the relatively fast passage of heat through the bondline (due to the relatively high thermal conductivity) and low contact resistances at the interfaces.

In exemplary embodiments, the thermal interface material comprises a base resin or matrix loaded with one or more thermally-conductive fillers. For example, a thermal material may comprise a silicone oil base resin of polydimethylsiloxane (PDMS) loaded with zinc oxide, aluminum, and/or alumina according to some exemplary embodiments. Or, for example, a thermal material may comprise a base resin or matrix of silicone polymer and catalyst combined with silicone polymer and SiH (silicon hydride) oligomer that is loaded with zinc oxide, aluminum, and/or alumina according to some other exemplary embodiments. As another example, a thermal interface material may comprise a matrix or base resin that includes process oil (e.g., paraffinic process oil, aromatic, and/or napthenic process oil, etc.) loaded with zinc oxide, aluminum, and/or alumina according to some further exemplary embodiments. The thermally-conductive filler loading level may be relatively high (e.g., a weight % of at least 80 or more, a weight % of at least 80 but less than 90, a weight % of 89, 90, 91, 92, 93, 94, or 95, etc.). In some exemplary embodiments, antioxidant, pigment, and coupling agent may also be present.

In some exemplary embodiments, the thermal interface material comprises a thermally-conductive gap filler sheet material. The sheet material may be free-standing without any reinforcement, such as when the sheet material has a thickness of 1 mm or greater. The sheet material may be supplied between liners (e.g., polymer release liners, etc.), which liners may include a corner tab for easier removal of the liners and easier handleablity (e.g., without the requirement of tools such as a spatula, etc.). Alternatively, the thermal interface material may be provided in bulk form in some exemplary embodiments.

The following three example formulations are meant to illustrate the general principles and properties of certain embodiments, and are not intended to limit the scope of the claims. The particular components and the weight in grams and weight percentages (weight %) of the components of each formulation may be varied in other exemplary embodiments. Accordingly, other exemplary embodiments of thermal interface materials may have a higher or lower thermal conductivity and/or a higher or lower secant modulus of elasticity than that disclosed below for the first, second, and third example formulations.

A first example of a thermal interface material comprised a crosslinked thermally-conductive gap filler having the following formulation:

| Component | Grams | Weight % |
|---|---|---|
| Silicone polymer with platinum catalyst | 40.63 | 2.89 |
| Silicone polymer with SiH crosslinking oligomer | 33.28 | 2.37 |
| Pigment | 0.8575 | 0.06 |
| Coupling Agent | 5 | 0.36 |
| Alumina (1) | 10.03 | 0.71 |
| Aluminum (1) | 245.67 | 17.47 |
| Aluminum (2) | 70.19 | 4.99 |
| Alumina (2) | 279.94 | 19.91 |
| Aluminum (3) | 122.93 | 8.74 |

-continued

| Component | Grams | Weight % |
|---|---|---|
| Aluminum (4) | 167.17 | 11.89 |
| Alumina (3) | 430.26 | 30.60 |

The first formulation included silicone polymer with platinum catalyst (e.g., GE Silicones RTV 6186 Part A, etc.), silicone polymer with SiH crosslinking oligomer (e.g., GE Silicones RTV 6186 Part B, etc.), pigment (e.g., PolyOne StanTone 24SP07, etc.), coupling agent (e.g., Gelest dodecyl (trimethoxy)silane, etc.), three different grades of alumina, and four different grades of aluminum. This first formulation included about 94.31 weight % of the thermally-conductive alumina and aluminum filler particles. More specifically, the first formulation included about 51.22 weight % of alumina and about 43.09 weight % of aluminum.

The thermal interface material having the first formulation had a secant modulus of elasticity of 17 kPa at 50% strain from an initial thickness of 1.5 mm. To determine the secant modulus of elasticity, ASTM D575 test method A was followed with the following specific test parameters: the test specimen or sample had an initial thickness of 1.5 mm with a surface area of 645.16 mm$^2$ in disk shape. The material of the test specimen was then deflected to 50% strain at a rate of 0.254 mm/minute with disk shape platens of surface area 645.16 mm$^2$. No sandpaper or lateral constraints were used during the testing and the sample was not subjected to repeated loading cycles (values were obtained during first loading cycle).

The thermal interface material having the first formulation had a three second hardness less of 38.1 Shore 00 and a thirty second hardness of 17.1 Shore 00. The three second hardness and thirty second hardness was determined by durometer as measured by ASTM D2240 on the Shore 00 scale.

The thermal interface material having the first formulation had a thermal conductivity of 9 W/mK. To determine thermal conductivity, a Hot Disk instrument was used that measures thermal conductivity, thermal diffusivity, and specific heat capacity using the Transient Plane Source Method. By way of background, this technique is covered under the ISO 22007-2:2008; Part 2 Standard. The technique utilizes a plane sensor and a special mathematical model that describes the heat conductivity, combined with electronics that enables the method to be used to measure Thermal Transport Properties. It covers a thermal conductivity range of typically 0.01-500 W/m/K. The Transient Plane Source technique typically employs two samples halves sandwiching the sensor. This method can also be used in a single-sided configuration. The technique is versatile and fast, covering measurements of solids, pastes, thin films and liquids. The technique can test both isotropic and anisotropic material. The flat sensor includes a continuous double spiral of electrically conducting nickel metal, etched out of a thin foil. The nickel spiral is situated between two layers of thin polyimide film Kapton. During the measurement, a constant electrical effect is passed through the conducting spiral, increasing the sensor temperature. The heat generated dissipates into the sample on both sides of the sensor, at a rate depending on the thermal transport properties of the material. By recording temperature versus time response in the sensor, the thermal conductivity, thermal diffusivity, and specific heat capacity of the material can be calculated.

A second example of a thermal interface material comprised a dispensable material having the following formulation:

| Component | Grams | Weight % |
| --- | --- | --- |
| PDMS | 76.905 | 6.68 |
| Pigment | 0.8575 | 0.07 |
| Coupling Agent | 5 | 0.43 |
| Alumina (1) | 10.5 | 0.91 |
| Aluminum (1) | 257.25 | 22.29 |
| Aluminum (2) | 73.50 | 6.37 |
| Alumina (2) | 293.13 | 25.40 |
| Aluminum (3) | 128.73 | 11.16 |
| Aluminum (4) | 175.05 | 15.17 |
| Alumina (3) | 132.93 | 11.52 |

The second formulation included polydimethylsiloxane (PDMS), pigment (e.g., Shin Etsu 1000 cst fluid, etc.), coupling agent (e.g., Gelest dodecyl(trimethoxy)silane, etc.), three different grades of alumina, and four different grades of aluminum. This second formulation included about 92.83 weight % of the thermally-conductive alumina and aluminum filler particles. More specifically, the second formulation included about 37.83 weight % of alumina and about 54.99 weight % of aluminum.

The thermal interface material having the second formulation had a thermal conductivity of 8.3 W/mK, which was determined using a Hot Disk instrument as described above. The thermal interface material having the second formulation had a three second hardness less than 5 Shore 00 and a thirty second hardness less than 5 Shore 00. The three second hardness and thirty second hardness was determined by durometer as measured by ASTM D2240 on the Shore 00 scale.

The thermal interface material having the second formulation had a secant modulus of elasticity of 3.8 kPa at 50% strain from an initial thickness of 1.5 mm, and a flow rate of 31.6 grams/minute. To determine the secant modulus of elasticity, ASTM D575 test method A was followed with the following specific test parameters: the test specimen or sample had an initial thickness of 1.5 mm with a surface area of 645.16 mm² in disk shape. The material of the test specimen was then deflected to 50% strain at a rate of 0.254 mm/minute with disk shape platens of surface area 645.16 mm². No sandpaper or lateral constraints were used during the testing and the sample was not subjected to repeated loading cycles (values were obtained during first loading cycle). To determine the flow rate, a 180 cc cartridge was filled with material and 90 psi of air pressure was applied for five 30 second intervals, forcing the material through a 0.125 inch opening tip each time. The weight of material dispensed in each 30 second interval was measured. The 5 values were averaged and converted to a grams per minute flow rate.

A third example of a thermal interface material comprised a thermally-conductive gap filler material having the following formulation:

| Component | Grams | Weight % |
| --- | --- | --- |
| Sunpar 2280 Paraffinic Process Oil | 94.86 | 6.65 |
| Pigment | 0.8575 | 0.06 |
| Coupling Agent | 5 | 0.34 |
| Alumina (1) | 10.03 | 0.70 |
| Aluminum (1) | 245.67 | 17.22 |
| Aluminum (2) | 70.19 | 4.92 |
| Alumina (2) | 279.94 | 19.62 |
| Aluminum (3) | 122.93 | 8.62 |
| Aluminum (4) | 167.17 | 11.72 |
| Alumina (3) | 430.26 | 30.15 |

The third formulation included process oil (e.g., Sunpar 2280 paraffinic process oil, etc.), pigment (e.g., PolyOne StanTone 24SP07, etc.), coupling agent (e.g., Gelest dodecyl (trimethoxy)silane, etc.), three different grades of alumina, and four different grades of aluminum. This third formulation included about 92.95 weight % of the thermally-conductive alumina and aluminum filler particles. More specifically, the third formulation included about 50.47 weight % of alumina and about 42.48 weight % of aluminum.

Figure 1:
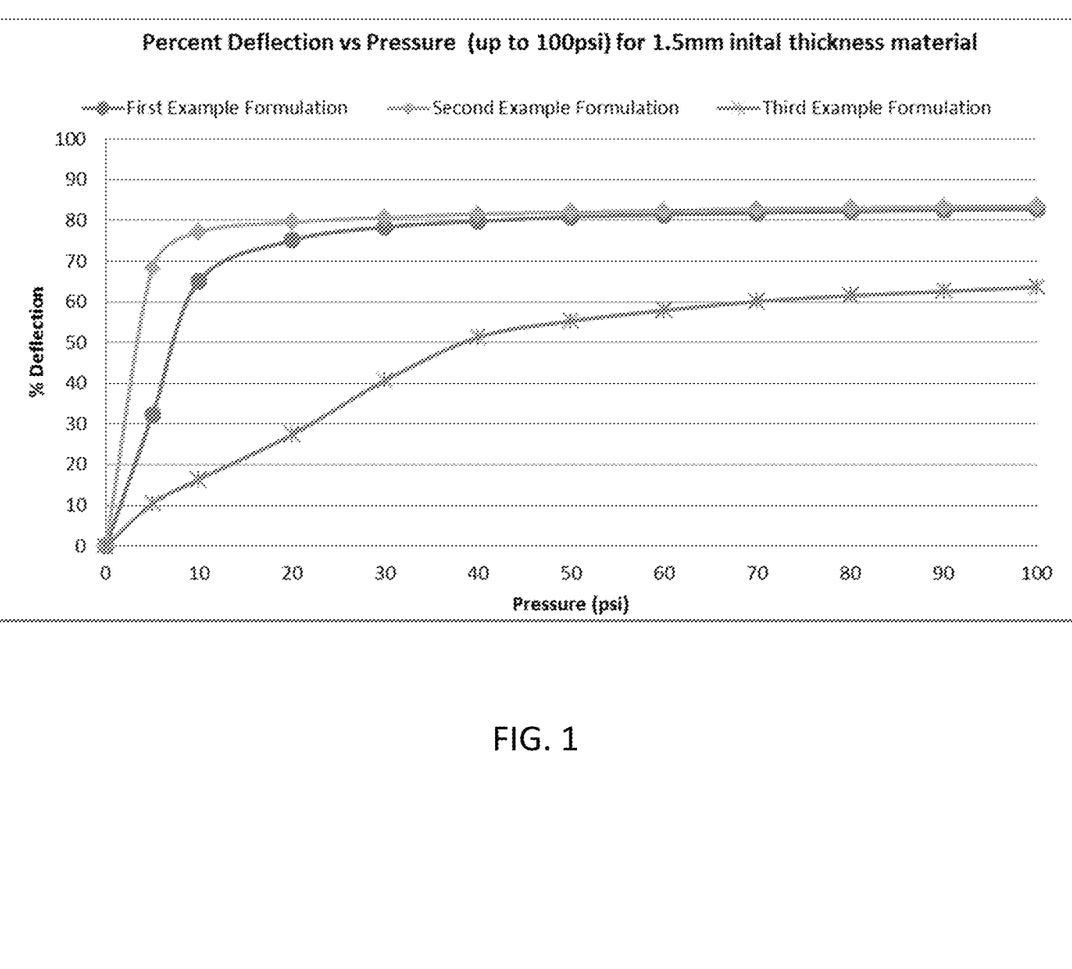
FIG. 1 is a line graph showing percent deflection versus pressure (in pounds per square inch (psi)) for three exemplary embodiments of thermal interface materials having different first, second, and third formulations and an initial thickness of 1.5 millimeter (mm)

The thermal interface material having the third formulation had a thermal conductivity of 9.08 W/mK, which was determined using a Hot Disk instrument as described above. The thermal interface material having the third formulation had a three second hardness of 63.9 and a thirty second hardness of 40.9. The three second hardness and thirty second hardness was determined by durometer as measured by ASTM D2240 on the Shore 00 scale. As shown by FIG. 1, the pressure was 39.6 psi at 50 percent deflection for the thermal interface material having the third formulation and a 1.5 mm initial thickness.

The thermal interface material having the third formulation had a secant modulus of elasticity of 269 kPa at 50% strain from an initial thickness of 1.5 mm. To determine the secant modulus of elasticity, ASTM D575 test method A was followed with the following specific test parameters: the test specimen or sample had an initial thickness of 1.5 mm with a surface area of 645.16 mm² in disk shape. The material of the test specimen was then deflected to 50% strain at a rate of 0.254 mm/minute with disk shape platens of surface area 645.16 mm². No sandpaper or lateral constraints were used during the testing and the sample was not subjected to repeated loading cycles (values were obtained during first loading cycle).

In the first, second, and third example formulations, the first grade of alumina (1) had a mean particle size of about 0.3 microns with particle sizes ranging from about 0.1 microns to about 0.6 microns. The particles of the first grade of alumina (1) were mostly spherical in shape. The second grade of alumina (2) had a mean particle size of about 1.5 microns with particle sizes ranging from about 1.2 microns to about 2 microns. The particles of the second grade of alumina (2) were mostly spherical in shape. The third grade of alumina (3) had a mean particle size of about 11 microns with particle sizes ranging from about 8 microns to about 16 microns. The particles of the third grade of alumina (3) were mostly spherical in shape. The first grade of aluminum (1) had a mean particle size of about 150 microns with particle sizes ranging from about 76 microns to about 260 microns. The particles of the first grade of aluminum (1) were mostly spherical in shape. The second grade of aluminum (2) had a mean particle size of about 80 microns with particle sizes ranging from about 46 microns to about 135 microns. The particles of the second grade of aluminum (2) were mostly spherical in shape. The third grade of aluminum (3) had a mean particle size of about 5 microns with particle sizes ranging from about 2.7 microns to about 9 microns. The particles of the grade of aluminum (3) were mostly spherical in shape. The fourth grade of aluminum (4) had a mean particle size of about 50 microns with particle sizes ranging from about 23 microns to about 90 microns. The particles of the fourth grade of aluminum (4) were mostly spherical in shape.

Figure 2:
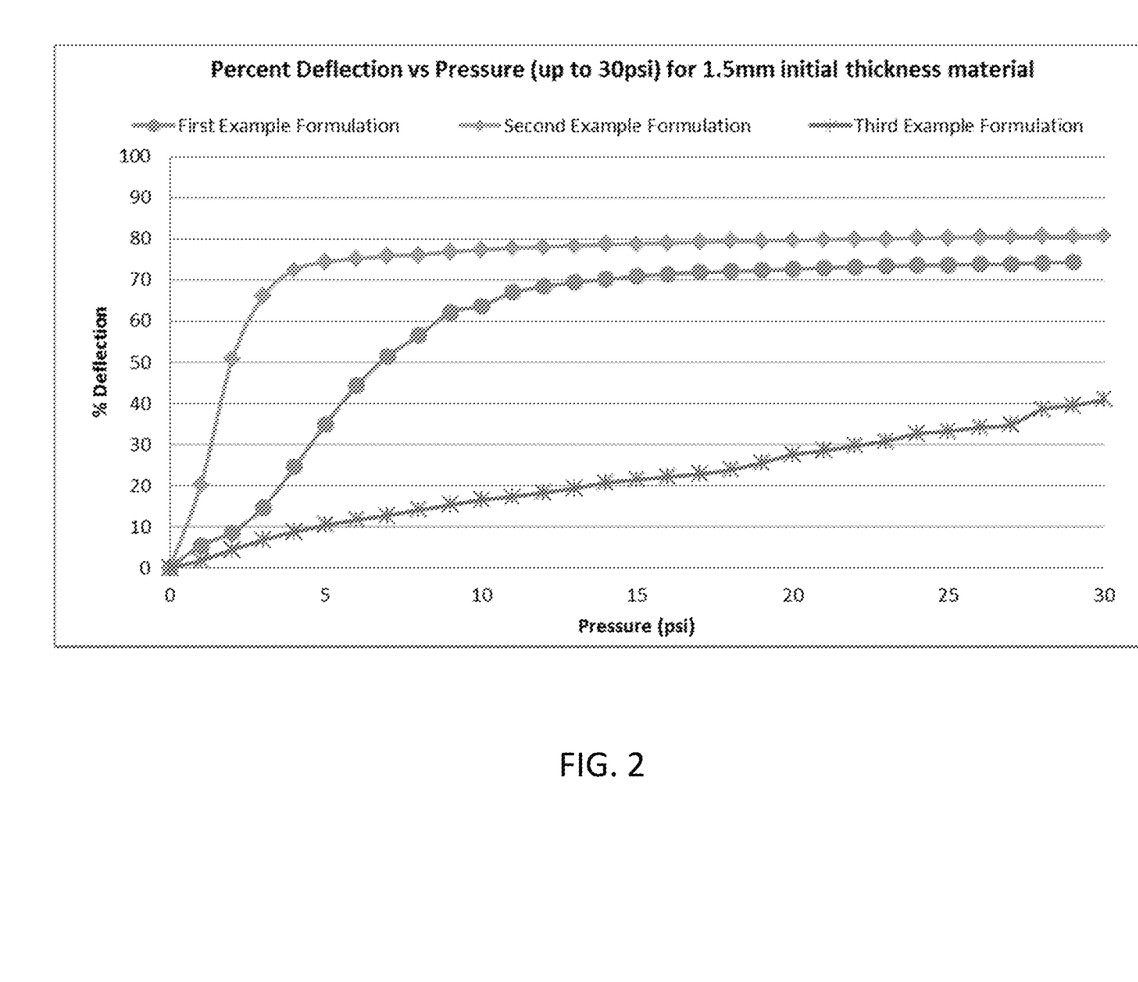
FIG. 2 is a line graph showing percent deflection versus pressure (up to 30 psi) for the three exemplary embodiments of thermal interface materials having the different first, second, and third formulations and an initial thickness of 1.5 millimeter (mm)
Figure 3:
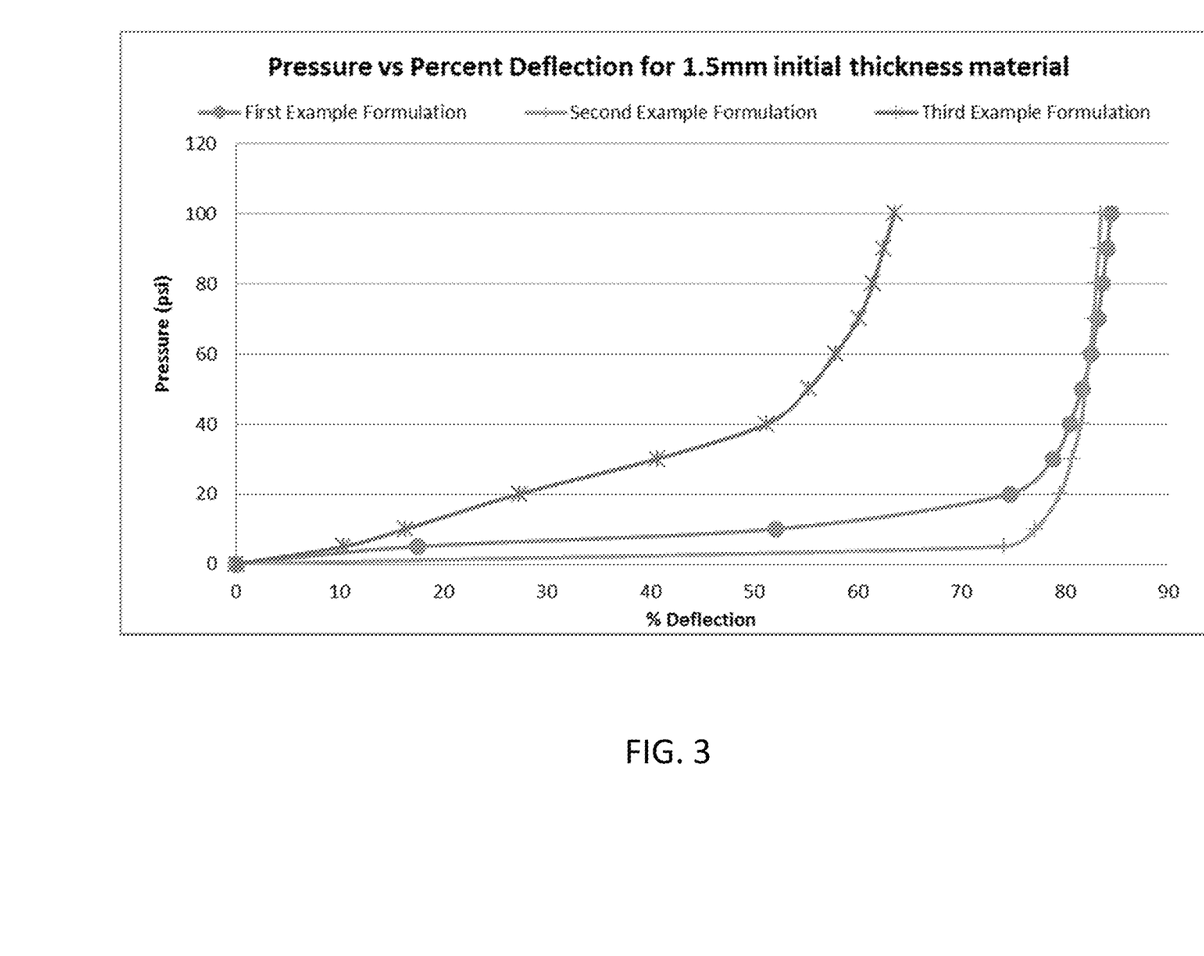
FIG. 3 is a line graph showing pressure versus percent deflection for the three exemplary embodiments of thermal interface materials having the different first, second, and third formulations and an initial thickness of 1.5 millimeter (mm).

FIGS. 1 and 2 line graphs showing percent deflection versus pressure (in pounds per square inch (psi)) for three exemplary embodiments of thermal interface materials having these different first, second, and third formulations and an initial thickness of 1.5 millimeter (mm). FIG. 3 is a line graph showing pressure versus percent deflection for the three exemplary embodiments of thermal interface materials having the different first, second, and third formulations and an initial thickness of 1.5 millimeter (mm). These line graphs and results therein are provided for purpose of illustration only as other embodiments may have a different formulation and/or have different performance than what is shown in FIGS. 1 through 3.

For thermal conductivity, the first, second, and third example formulations included aluminum and alumina. Advantageously, alumina is relatively low cost and is available in various particle sizes, which allows for nesting or packing of alumina particles to increase volume loading of the alumina for higher thermal conductivity. Other exemplary embodiments may include one or more other thermally-conductive fillers instead of or in addition to alumina and aluminum. For example, other exemplary embodiments may include one or more of the following thermally-conductive fillers: zinc oxide, boron nitride, silicon nitride, aluminum nitride, iron, metallic oxides, graphite, ceramics, copper, silver, combinations thereof (e.g., alumina and zinc oxide, etc.), etc. In addition, exemplary embodiments may also include different grades (e.g., different sizes, different particle size distributions, different purities, different shapes, etc.) of the same (or different) thermally-conductive fillers. By varying the types and grades of thermally-conductive fillers, the final characteristics of the thermal interface material (e.g., thermal conductivity, cost, hardness, compliancy, etc.) may be varied as desired. In exemplary embodiments disclosed herein, the thermal interface material has a thermal conductivity of at least 6 W/mK or more. For example, the thermal interface materials having the example the first, second, and third formulations above had thermal conductivities of 9 W/mK, 8.3 W/mK, and 9.08 W/mK, respectively. In another exemplary embodiment, a thermal interface material including zinc oxide containing (or fourth) formulation has a thermal conductivity of 8 W/mK and a secant modulus of elasticity of 517 kPa at 50% strain from an initial thickness of 1.5 mm. The specific formulations and values disclosed herein for secant modulus of elasticity and thermal conductivity are examples only as other embodiments may include a thermal interface material with a different formulation, different secant modulus of elasticity, and/or a different thermal conductivity, etc.

Below is a table that includes the secant modulus elasticity (modulus), thermal conductivity (TC), ratio of secant modulus of elasticity to thermal conductivity, and ratio of thermal conductivity to secant modulus of elasticity for the thermal interface materials having the first formulation, second formulation, third formulation, and zinc oxide containing (or fourth) formulation. As shown by the table below, exemplary embodiments disclosed herein may have a ratio of secant modulus of elasticity to thermal conductivity that falls within a range from about 0.46 to about 64.6 and/or a ratio of thermal conductivity to secant modulus of elasticity that falls within a range from about 0.015 to about 2.18. Exemplary embodiments disclosed herein may have a ratio of secant modulus of elasticity to thermal conductivity that is at least about 0.46 and/or no more than about 64.6 and/or a ratio of thermal conductivity to secant modulus of elasticity that is at least about 0.015 and/or no more than about 2.18.

| Formulation | Modulus (kPa) | TC (W/mK) | Ratio of Modulus/TC | Ratio of TC/Modulus |
| --- | --- | --- | --- | --- |
| 1 | 17 | 9 | 1.88 | 0.53 |
| 2 | 3.8 | 8.3 | 0.46 | 2.18 |
| 3 | 269 | 9.1 | 29.6 | 0.034 |
| 4 | 517 | 8 | 64.6 | 0.015 |

By way of example, an exemplary embodiment of a thermal interface material disclosed herein may have a ratio of secant modulus of elasticity to thermal conductivity of about 1.88 and/or a ratio of thermal conductivity to secant modulus of elasticity of about 0.53. As another example, an exemplary embodiment of a thermal interface material disclosed herein may have a ratio of secant modulus of elasticity to thermal conductivity of about 0.46 and/or a ratio of thermal conductivity to secant modulus of elasticity of about 2.18. As yet another example, an exemplary embodiment of a thermal interface material disclosed herein may have a ratio of secant modulus of elasticity to thermal conductivity of about 29.6 and/or a ratio of thermal conductivity to secant modulus of elasticity of about 0.034. As a further example, an exemplary embodiment of a thermal interface material disclosed herein may have a ratio of secant modulus of elasticity to thermal conductivity of about 64.6 and/or a ratio of thermal conductivity to secant modulus of elasticity of about 0.015.

The first and second example formulations included a silicone matrix or base resin. More specifically, the first example formulation included a matrix or base resin comprising silicone polymer with platinum catalyst and crosslinker. The second example formulation included a silicone oil matrix or base resin comprising polydimethylsiloxane (PDMS). The third example formulation included a "non-silicone" matrix or base resin that did not include silicone. More specifically, the third example formulation included a matrix or base resin comprising a paraffinic process oil (e.g., Sunpar 2280 paraffinic process oil, etc.). In other exemplary embodiments, the matrix or base resin may comprise other materials, such as thermoset polymers including polyurethanes, rubber (e.g., SBR, nitrile, butyl, isoprene, EPDM, etc.), etc. By way of additional examples, the matrix material may comprise thermoplastic matrix materials, acrylics, polyolefins, polyamides, polyesters, polyurethanes, polycarbonates, polystyrene and styrenic copolymers, acrylnitriles, polyvinyl chlorides, polysulfones, acetals, polyarlyates, polypropylenes, surlyns, polyethylene terephthalates, polystyrenes, combinations thereof, etc. The matrix or base resin may also comprise fluids, resins or oils such as process oils (paraffinic, aromatic, napthenic), hydraulic oils, lubricating oils, non-silicone base resins or matrix materials, etc. The matrix may be selected based on the particular amount of thermally-conductive filler material that may be suspended or added to the matrix.

By way of example only, the following is a description of an exemplary process that may be used for making a thermal interface material having the example first formulation. A high speed mixer may be used to mix the silicone polymer with catalyst and the silicone polymer with SiH oligomer. The pigment, coupling agent, three different grades of alumina, and four different grades of aluminum may be loaded (e.g., added and mixed, etc.) into the silicone polymer with catalyst and silicone polymer with SiH oligomer. The pigment, coupling agent, alumina, and aluminum may be slowly added individually or collectively (e.g., simultaneously, etc.) and then mixed until well blended. For example, the components may be added in the order that they are listed above in the table. The mixture may be placed under vacuum (e.g., for about 5 minutes, etc.) to remove air, or the vacuum may be applied during the mixing operation. A gap may be set between calendering rolls for the desired product thickness. The mixture may be rolled between two release liners in-between the calendering rolls. The resulting sheets may be cured (crosslinked) in an oven, e.g., at 260 degrees Fahrenheit for about 1 to 2 hours depending on thickness.

In exemplary embodiments, a thermal interface material may be used to define or provide part of a thermally-conductive heat path from a heat source to a heat removal/dissipation structure or component. A thermal interface material disclosed herein may be used, for example, to help conduct thermal energy (e.g., heat, etc.) away from a heat source of an electronic device (e.g., one or more heat generating components, central processing unit (CPU), die, semiconductor device, etc.). A thermal interface material may be positioned generally between a heat source and a heat removal/dissipation structure or component (e.g., a heat spreader, a heat sink, a heat pipe, a device exterior case or housing, etc.) to establish a thermal joint, interface, pathway, or thermally-conductive heat path along which heat may be transferred (e.g., conducted) from the heat source to the heat removal/dissipation structure or component. During operation, the thermal interface material may then function to allow transfer (e.g., to conduct heat, etc.) of heat from the heat source along the thermally-conductive path to the heat removal/dissipation structure or component.

In exemplary embodiments, an interface material may comprise a matrix or base resin loaded with filler. The interface material may have a secant modulus of elasticity of no more than 620 kilopascals (kPa) at 50% strain for 1.5 millimeter (mm) initial thickness material.

A ratio of the interface material's secant modulus of elasticity to thermal conductivity may fall within a range from about 0.46 to about 64.6 and/or a ratio of the interface material's thermal conductivity to secant modulus of elasticity may fall within a range from about 0.015 to about 2.18. The matrix or base resin may be loaded with the filler such that the interface material includes at least 80 weight % of the filler. The matrix or base resin may comprise a polydimethylsiloxane (PDMS); or silicone polymer with platinum catalyst and crosslinker; or a process oil.

The filler may comprise one or more of alumina, aluminum, zinc oxide, boron nitride, silicon nitride, aluminum nitride, iron, metallic oxides, graphite, silver, copper, and ceramic. The interface material may have a thermal conductivity greater than 4 W/mK (e.g., at least about 5.5 W/mK, at least about 5.7 W/mK, etc.). The matrix or base resin may be loaded with the filler such that the interface material includes at least 90 weight % of the filler. The matrix or base resin may comprise silicone polymer with platinum catalyst and silicone polymer with SiH crosslinking oligomer. The interface material may be a dispensable material or a bulk putty.

Example embodiments of thermal interface materials disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to use with any single type of heat source, electronic device, heat removal/dissipation structure, etc.

Exemplary embodiments may provide one or more (but not necessarily any or all) of the following advantages, such as having or demonstrating a unique combination of relatively high thermal conductivity coupled with very high compliancy/low secant modulus. The combination of high thermal conductivity and a low secant modulus allows a thermal interface material to be more easily deflected to the desired bondline, which, in turn, may help prevents excess pressures from building up during deflection and damaging delicate components. At the bondline, the thermal resistance is very low due to the relatively fast passage of heat through the bondline (due to the relatively high thermal conductivity) and low contact resistances at the interfaces. The thermal interface material may have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the thermal interface material to closely conform to a mating surface when placed in contact with the mating surface, including a non-flat, curved or uneven mating surface. For example, the thermal interface material may have very high compliancy such that the thermal interface material will relatively closely conform to the size and outer shape of an electrical component when the thermal interface material is along an inner surface of a cover of an EMI shield and the thermal interface material is compressed against the electrical component when the EMI shield is installed to a printed circuit board over the electrical component.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An interface material comprising a matrix or base resin loaded with a filler, wherein:
    the interface material has a secant modulus of elasticity of no more than 620 kilopascals (kPa) at 50% strain for 1.5 millimeter (mm) initial thickness material;
    a ratio of the interface material's secant modulus of elasticity to thermal conductivity falls within a range from about 0.46 to about 64.6 and/or a ratio of the interface material's thermal conductivity to secant modulus of elasticity falls within a range from about 0.015 to about 2.18;
    the interface material is a bulk putty, a thermally-conductive gap filler pad, or a thermally-conductive gap filler sheet material;
    the matrix or base resin is loaded with the filler such that the interface material includes at least 80 weight % of the filler; and the matrix or base resin comprises:
a polydimethylsiloxane (PDMS); or
silicone polymer with platinum catalyst and crosslinker; or
a process oil.

2. The interface material of claim 1, wherein the filler comprises one or more of alumina, aluminum, zinc oxide, boron nitride, silicon nitride, aluminum nitride, iron, metallic oxides, graphite, silver, copper, and ceramic.

3. The interface material of claim 1, wherein the interface material has a thermal conductivity greater than 4 Watts per meter per Kelvin.

4. The interface material of claim 1, wherein the interface material has a thermal conductivity of at least about 5.5 Watts per meter per Kelvin.

5. The interface material of claim 4, wherein the filler comprises alumina.

6. The interface material of claim 1, wherein the interface material has a thermal conductivity of at least about 5.7 Watts per meter per Kelvin.

7. The interface material of claim 1, wherein the matrix or base resin is loaded with the filler such that the interface material includes at least 90 weight % of the filler.

8. The interface material of claim 1, wherein the matrix or base resin comprises the silicone polymer with the platinum catalyst and the crosslinker including silicone polymer with SiH crosslinking oligomer.

9. An interface material comprising a matrix or base resin loaded with a filler, wherein:
the interface material has a secant modulus of elasticity of no more than 620 kilopascals (kPa) at 50% strain for 1.5 millimeter (mm) initial thickness material;
the matrix or base resin is loaded with the filler such that the interface material includes
at least 80 weight % of the filler;
the matrix or base resin comprises:
a polydimethylsiloxane (PDMS); or
silicone polymer with platinum catalyst and crosslinker;
a ratio of the interface material's secant modulus of elasticity to thermal conductivity falls within a range from about 0.46 to about 64.6 and/or a ratio of the interface material's thermal conductivity to secant modulus of elasticity falls within a range from about 0.015 to about 2.18; and
the interface material is a bulk putty, a thermally-conductive gap filler pad, or a thermally-conductive gap filler sheet material.

10. The interface material of claim 9, wherein the filler comprises one or more of alumina, aluminum, zinc oxide, boron nitride, silicon nitride, aluminum nitride, iron, metallic oxides, graphite, silver, copper, and ceramic.

11. The interface material of claim 9, wherein the interface material has a thermal conductivity greater than 4 Watts per meter per Kelvin.

12. The interface material of claim 9, wherein the interface material has a thermal conductivity of at least about 5.5 Watts per meter per Kelvin.

13. The interface material of claim 12, wherein the filler comprises alumina.

14. The interface material of claim 9, wherein the interface material has a thermal conductivity of at least about 5.7 Watts per meter per Kelvin.

15. The interface material of claim 9, wherein the matrix or base resin is loaded with the filler such that the interface material includes at least 90 weight % of the filler.

16. The interface material of claim 9, wherein the matrix or base resin comprises the silicone polymer with the platinum catalyst and the crosslinker including silicone polymer with SiH crosslinking oligomer.

17. An interface material comprising a matrix or base resin loaded with a filler, wherein:
the interface material has a secant modulus of elasticity of no more than 620 kilopascals (kPa) at 50% strain for 1.5 millimeter (mm) initial thickness material;
the interface material has a thermal conductivity greater than 4 Watts per meter per Kelvin;
the matrix or base resin is loaded with the filler such that the interface material includes at least 80 weight % of the filler;
the matrix or base resin comprises silicone polymer with platinum catalyst and silicone polymer with SiH crosslinking oligomer; and
the interface material is a bulk putty, a thermally-conductive gap filler pad, or a thermally-conductive gap filler sheet material.

18. The interface material of claim 1, wherein the interface material is the thermally-conductive gap filler pad.

19. The interface material of claim 9, wherein the interface material is the thermally-conductive gap filler pad.

20. The interface material of claim 17, wherein the interface material is the thermally-conductive gap filler pad.

* * * * *